US012025899B2

(12) United States Patent
Muramoto et al.

(10) Patent No.: US 12,025,899 B2
(45) Date of Patent: Jul. 2, 2024

(54) DISPLAY DEVICE

(71) Applicant: Japan Display Inc., Tokyo (JP)

(72) Inventors: Tatsunori Muramoto, Tokyo (JP); Kentaro Kawai, Tokyo (JP); Yoshihide Ohue, Tokyo (JP); Akihiro Hanada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/349,217

(22) Filed: Jul. 10, 2023

(65) Prior Publication Data

US 2023/0350257 A1 Nov. 2, 2023

Related U.S. Application Data

(63) Continuation of application No. PCT/JP2021/042295, filed on Nov. 17, 2021.

(30) Foreign Application Priority Data

Jan. 12, 2021 (JP) ................. 2021-002856

(51) Int. Cl.
*G02F 1/1368* (2006.01)
*G02F 1/1334* (2006.01)
*G02F 1/1362* (2006.01)
*H01L 27/12* (2006.01)

(52) U.S. Cl.
CPC .......... *G02F 1/1368* (2013.01); *G02F 1/1334* (2013.01); *G02F 1/136286* (2013.01); *H01L 27/1248* (2013.01)

(58) Field of Classification Search
CPC ..................................... G02F 1/1334
See application file for complete search history.

(56) References Cited

U.S. PATENT DOCUMENTS

2002/0039813 A1* 4/2002 Yamazaki ......... H01L 29/78645
438/151
2008/0137015 A1 6/2008 Niiya
(Continued)

FOREIGN PATENT DOCUMENTS

JP 2019-160399 A 9/2019

OTHER PUBLICATIONS

International Search Report mailed on Feb. 8, 2022, for the corresponding PCT Application No. PCT/JP2021/042295, with English machine translation.
(Continued)

*Primary Examiner* — Sang V Nguyen
(74) *Attorney, Agent, or Firm* — Michael Best & Friedrich LLP

(57) ABSTRACT

According to one embodiment, a display device includes a first substrate including a first transparent substrate, a switching element including an oxide semiconductor, an organic insulating film covering the switching element, a transparent electrode including a first aperture penetrating to an upper surface of the organic insulating film, an inorganic insulating film including a second aperture penetrating to the upper surface in the first aperture, and a pixel electrode electrically connected to the switching element, and a second substrate including a second transparent substrate and opposed to the first substrate.

10 Claims, 15 Drawing Sheets

(56) References Cited

U.S. PATENT DOCUMENTS

| | | | |
|---|---|---|---|
| 2012/0127148 A1* | 5/2012 | Lee | G09G 3/3688 345/212 |
| 2015/0090993 A1 | 4/2015 | Tokuda et al. | |
| 2015/0325592 A1 | 11/2015 | Jia et al. | |
| 2017/0010500 A1* | 1/2017 | Han | G02F 1/133345 |
| 2017/0293191 A1* | 10/2017 | Tomioka | G02F 1/134309 |
| 2018/0031758 A1 | 2/2018 | Mizuno et al. | |
| 2018/0040645 A1 | 2/2018 | Ishii et al. | |
| 2018/0120619 A1 | 5/2018 | Cho et al. | |
| 2021/0286226 A1* | 9/2021 | Sugiyama | G02F 1/133616 |
| 2022/0004052 A1 | 1/2022 | Ohue | |

OTHER PUBLICATIONS

English translation of the Japanese Office Action for the corresponding Japanese Application No. 2022-575098 dated Jan. 9, 2024.

\* cited by examiner

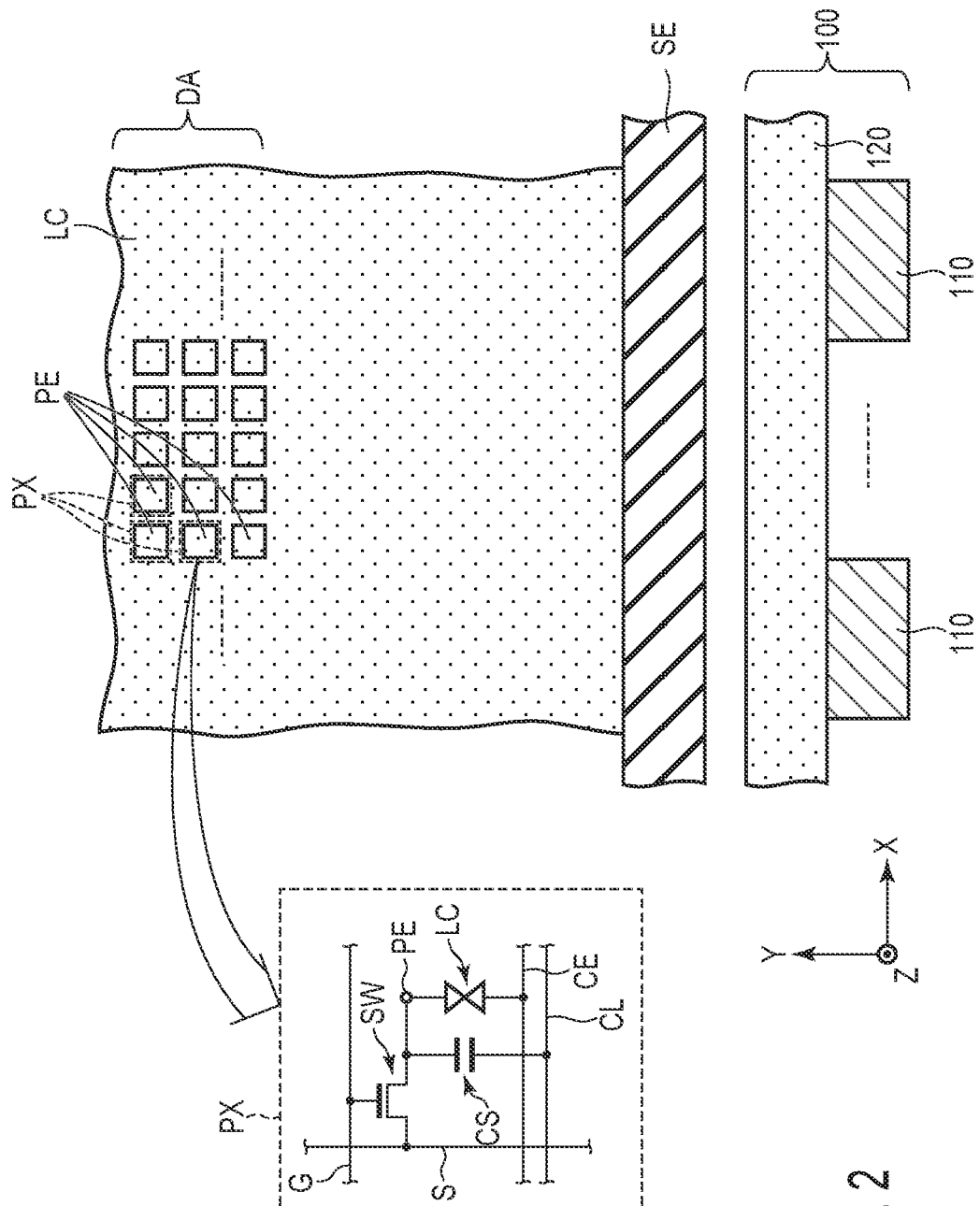
F I G. 2

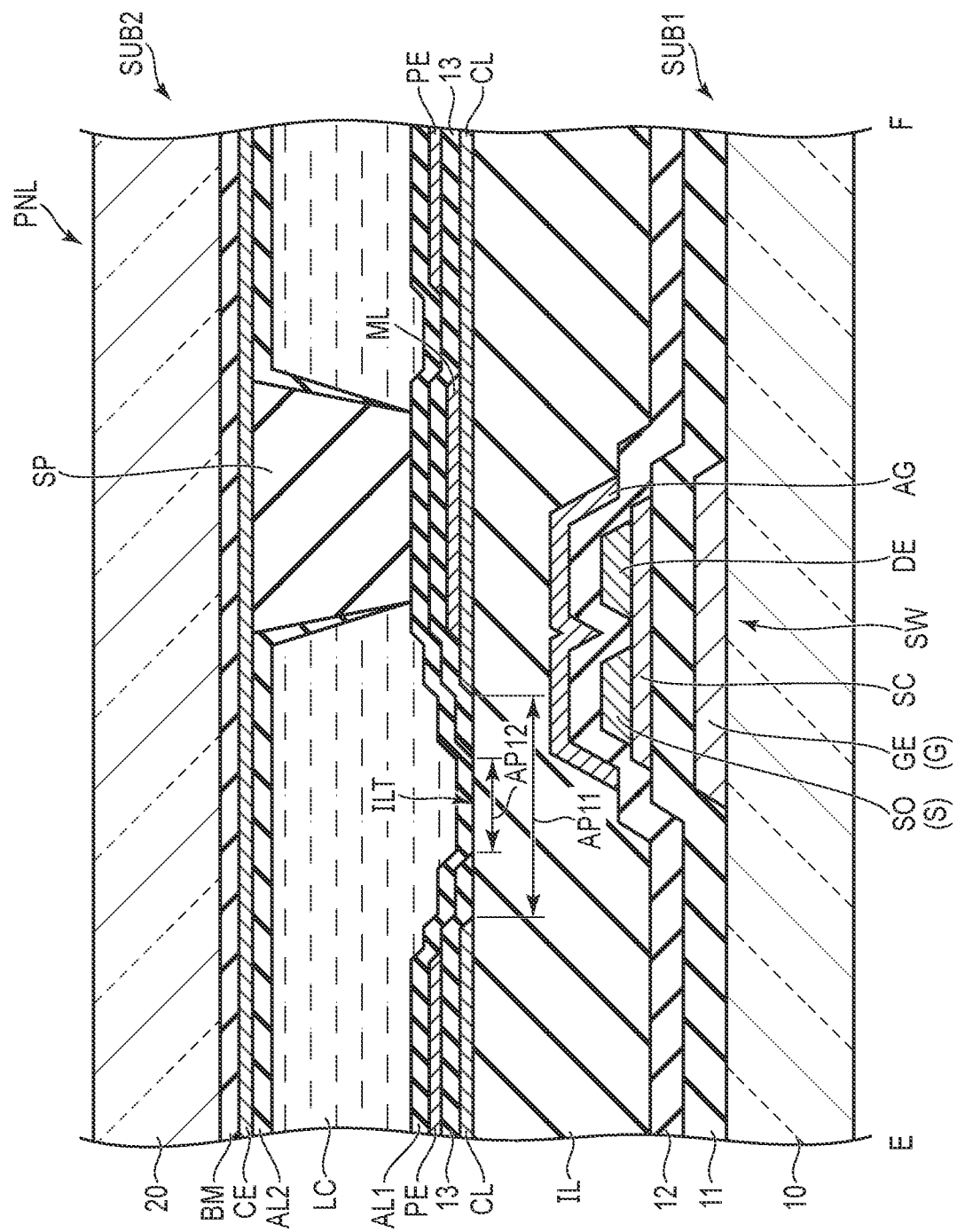
F I G. 8

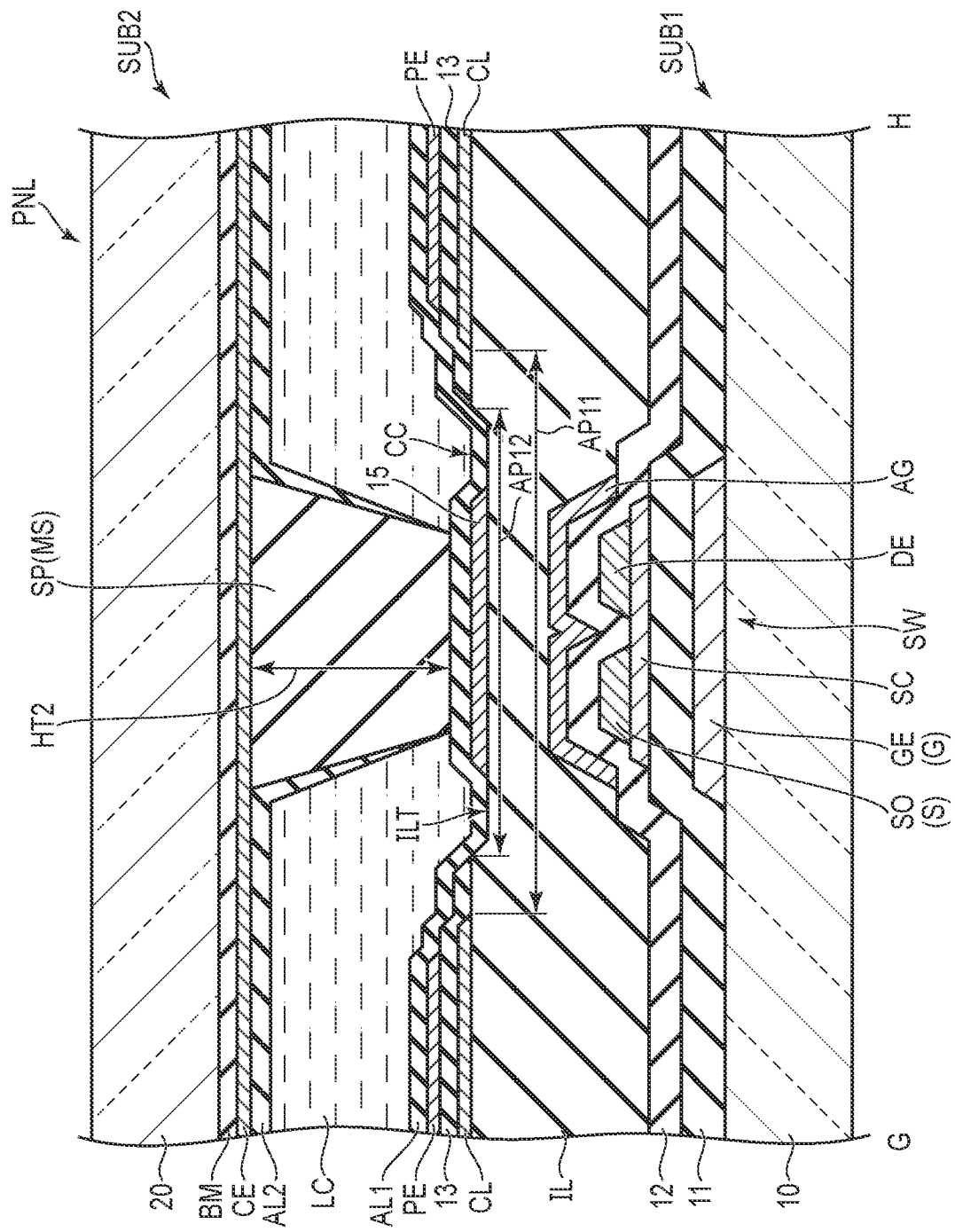
F I G. 13

DISPLAY DEVICE

CROSS-REFERENCE TO RELATED APPLICATIONS

This application is a Continuation Application of PCT Application No. PCT/JP2021/042295, filed Nov. 17, 2021 and based upon and claiming the benefit of priority from Japanese Patent Application No. 2021-002856, filed Jan. 12, 2021, the entire contents of all of which are incorporated herein by reference.

FIELD

Embodiments described herein relate generally to a display device.

BACKGROUND

In recent years, various display devices using a polymer dispersed liquid crystal capable of switching a scattering state in which incident light is scattered and a transparent state in which incident light is transmitted have been proposed. In one example, a display device comprising a first translucent substrate, a second translucent substrate, a liquid crystal layer containing polymer dispersed liquid crystal sealed between the first translucent substrate and the second translucent substrate, and at least one light emitting unit opposed to at least one side surface of the first translucent substrate and the second translucent substrate is disclosed.

BRIEF DESCRIPTION OF THE DRAWINGS

FIG. 2 is a plan view showing an area in the vicinity of the light emitting module 100.

FIG. 8 is a cross-sectional view showing an example of the display panel PNL including the first substrate SUB1 along line E-F shown in FIG. 5.

FIG. 13 is a cross-sectional view showing yet another example of the display panel PNL including the first substrate SUB1 along line G-H shown in FIG. 9.

DETAILED DESCRIPTION

Figure 1:
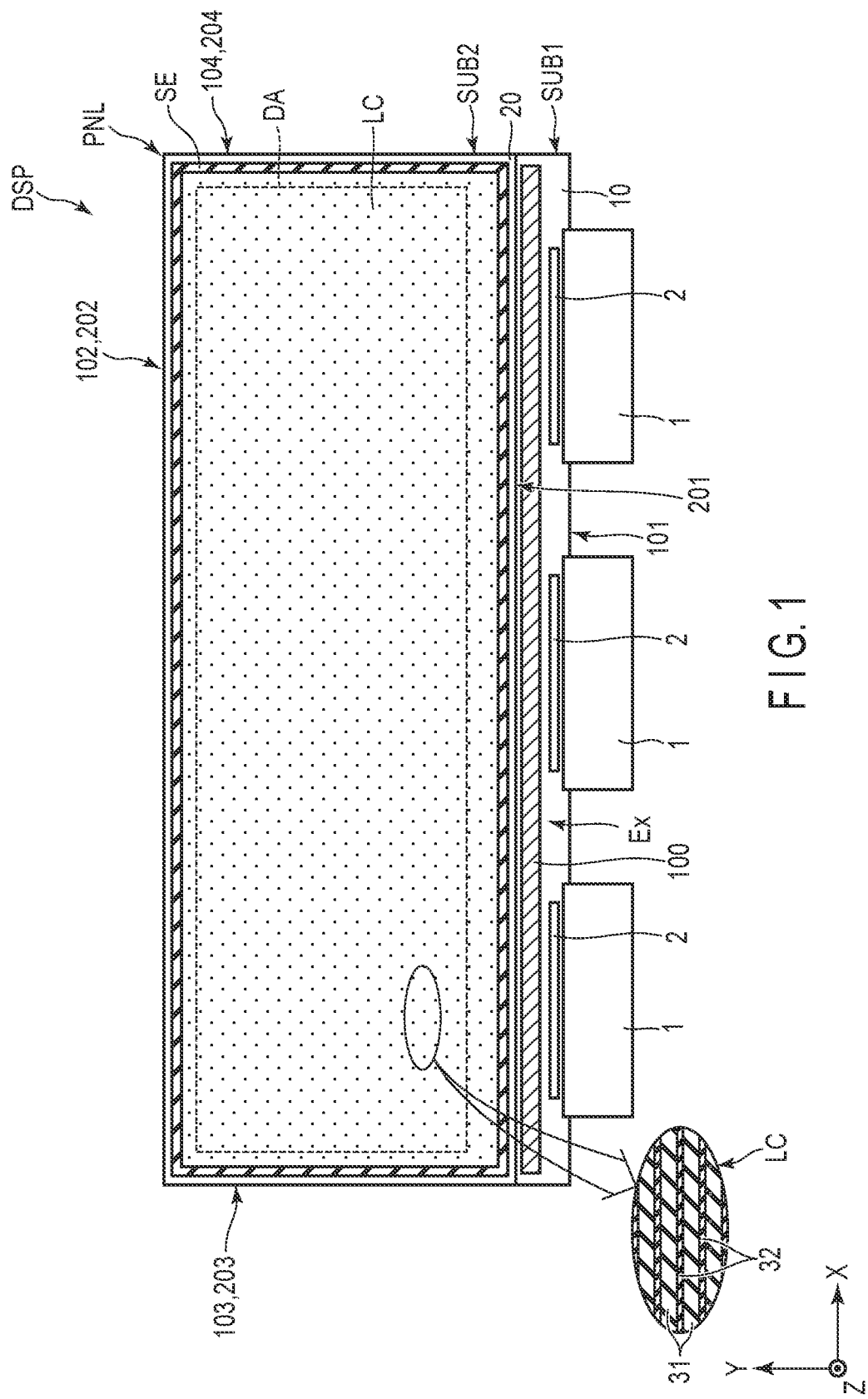
FIG. 1 is a plan view showing an example of a display device DSP according to an embodiment.

Embodiments described herein aim to provide a display device capable of suppressing the reduction in reliability.

In general, according to one embodiment, a display device comprises: a first substrate comprising a first transparent substrate, a switching element comprising an oxide semiconductor, an organic insulating film covering the switching element, a transparent electrode including a first aperture penetrating to an upper surface of the organic insulating film, an inorganic insulating film including a second aperture penetrating to the upper surface in the first aperture, and a pixel electrode electrically connected to the switching element; and a second substrate comprising a second transparent substrate and opposed to the first substrate.

According to the embodiment, a display device capable of suppressing the reduction in reliability can be provided.

One of embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

In the present embodiment, a liquid crystal display device will be described as an example of the display device. A main configuration disclosed in the present embodiment can be applied not only to an electrophoretic display device and a display device comprising a self-luminous light emitting element such as an organic electroluminescent (EL) element, micro-LED or mini-LED, but also to various electronic devices such as a capacitive sensor and an optical sensor.

FIG. 1 is a plan view showing an example of a display device DSP according to the embodiment. As an example, the first direction X, the second direction Y, and the third direction Z are orthogonal to each other but may intersect at an angle other than 90 degrees. The first direction X and the second direction Y correspond to the directions parallel to the main surface of a substrate constituting the display device DSP, and the third direction Z corresponds to the thickness direction of the display device DSP. In the present embodiment, viewing an X-Y plane defined by the first direction X and the second direction Y is referred to as planar view.

The display device DSP comprises a display panel PNL, a wiring board 1, an IC chip 2, and a light emitting module 100.

The display panel PNL comprises a first substrate SUB1, a second substrate SUB2, a liquid crystal layer LC containing polymer dispersed liquid crystal, and a sealant SE. The first substrate SUB1 and the second substrate SUB2 are formed in a flat plate parallel to the X-Y plane. The first substrate SUB1 and the second substrate SUB2 overlap in planar view. An area where the first substrate SUB1 and the second substrate SUB2 overlap includes a display area DA where images are displayed.

The first substrate SUB1 comprises a first transparent substrate 10, and the second substrate SUB2 comprises a second transparent electrode 20. The first transparent substrate 10 has side surfaces 101 and 102 along the first direction X and side surfaces 103 and 104 along the second direction Y. The second transparent substrate 20 has side surfaces 201 and 202 along the first direction X and side surfaces 203 and 204 along the second direction Y.

In the example shown in FIG. 1, the side surfaces 102 and 202, the side surfaces 103 and 203, and the side surfaces 104 and 204 overlap, respectively, in planar view, but may not necessarily overlap. The side surface 201 does not overlap with the side surface 101 but is located between the side surface 101 and the display area DA. The first substrate SUB1 includes an extending portion Ex between the side surface 101 and the side surface 201. In other words, the extending portion Ex corresponds to a portion of the first substrate SUB1, which extends in the second direction Y from a portion overlapping with the second substrate SUB2, and does not overlap with the second substrate SUB2.

In addition, in the example shown in FIG. 1, the display portion PNL is formed in a rectangular shape extending in the first direction X. In other words, the side surfaces 101 and 102 and the side surfaces 201 and 202 are side surfaces along the long sides of the display panel PNL, and the side surfaces 103 and 104 and the side surfaces 203 and 204 are side surfaces along the short sides of the display panel PNL. The display panel PNL may be formed in a rectangular shape extending in the second direction Y, a square shape, the other polygonal shape, or the other shape such as a circular shape or an elliptical shape.

The wiring board 1 and the IC chip 2 are mounted on the extending portion Ex. The wiring board 1 is, for example, a flexible printed circuit board that can be bent. The IC chip 2 incorporates, for example, a display driver which outputs signals necessary for image display, and the like. The IC chip 2 may be mounted on the wiring board 1. In the example shown in FIG. 1, a plurality of wiring boards 1 arranged in the first direction X are mounted on the display panel PNL, but a single wiring board 1 extending in the first direction X may be mounted. In addition, a plurality of IC chips 2 arranged in the first direction X are mounted on the display panel PNL, but a single IC chip 2 extending in the first direction X may be mounted.

Details of the light emitting module 100 will be described later, but the light emitting module 100 overlaps with the extending portion Ex and is arranged along the side surface 201 of the second transparent substrate 20 in planar view.

The sealant SE bonds the first substrate SUB1 and the second substrate SUB2. In addition, the sealant SE is formed in a rectangular frame shape, and surrounds the liquid crystal layer LC between the first substrate SUB1 and the second substrate SUB2.

The liquid crystal layer LC is held between the first substrate SUB1 and the second substrate SUB2. Such a liquid crystal layer LC is arranged over an area (including the display area DA) surrounded by the sealant SE in planar view.

As enlarged and schematically shown in FIG. 1, the liquid crystal layer LC contains polymer 31 and liquid crystal molecules 32. As an example, the polymer 31 is liquid crystal polymer. The polymer 31 is formed in a stripe shape extending along the first direction X and is arranged in the second direction Y. The liquid crystal molecules 32 are dispersed in gaps of the polymer 31 and aligned such that their major axes extend in the first direction X. Each of the polymer 31 and the liquid crystal molecules 32 has optical anisotropy or refractive anisotropy. The response performance of the polymer 31 to the electric field is lower than the response performance of the liquid crystal molecules 32 to the electric field.

As an example, the direction of alignment of the polymer 31 is hardly varied irrespective of the presence or absence of the electric field. In contrast, the direction of alignment of the liquid crystal molecules 32 is varied in accordance with the electric field in a state in which a voltage higher than or equal to a threshold value is applied to the liquid crystal layer LC. In a state in which the voltage is not applied to the liquid crystal layer LC (initial alignment state), optical axes of the polymer 31 and the liquid crystal molecules 32 are parallel to each other and the light made incident on the liquid crystal layer LC is almost transmitted through the liquid crystal layer LC (transparent state). In a state in which a voltage is applied to the liquid crystal layer LC, the alignment direction of the liquid crystal molecules 32 changes, and the optical axes of the respective polymer 31 and liquid crystal molecules 32 intersect with each other. Therefore, the light made incident on the liquid crystal layer LC is scattered in the liquid crystal layer LC (scattered state).

FIG. 2 is a plan view showing an area in the vicinity of the light emitting module 100. The light emitting module 100 comprises a plurality of light emitting elements 110 and a light guide 120. The plurality of light emitting elements 110 are arranged in the first direction X. The light guide 120 is formed in a rod shape extending in the first direction X. The light guide 120 is located between the sealant SE and the light emitting elements 110.

The display area DA comprises a plurality of pixels PX arranged in a matrix in the first direction X and the second direction Y. These pixels PX are shown by dotted lines in the figure. In addition, each of the pixels PX comprises a pixel electrode PE represented as a square of a solid line in the figure.

As shown and enlarged in FIG. 2, each pixel PX comprises a switching element SW. The switching element SW is constituted by, for example, a thin-film transistor (TFT) and is electrically connected to a scanning line G and a signal line S. The scanning line G is electrically connected to the switching element SW in each of the pixels PX arranged in the first direction X. The signal line S is electrically connected to the switching element SW in each of the pixels PX arranged in the second direction Y. The pixel electrode PE is electrically connected to the switching element SW.

The common electrode CE and the feed line CL are arranged over the display area DA and its surrounding area. A common voltage Vcom is applied to the common electrode CE. For example, a voltage having the same potential as the common electrode CE is applied to the feed line CL.

Each of the pixel electrodes PE is opposed to the common electrode CE in the third direction Z. In the display area DA, the liquid crystal layer LC (particularly, liquid crystal molecules 32) is driven by an electric field produced between the pixel electrode PE and the common electrode CE. A capacitance CS is formed, for example, between the feed line CL and the pixel electrode PE.

The scanning line G, the signal line S, the feed line CL, the switching element SW, and the pixel electrode PE are provided on the first substrate SUB1, and the common electrode CE is provided on the second substrate SUB2, which will be described later.

Figure 3:
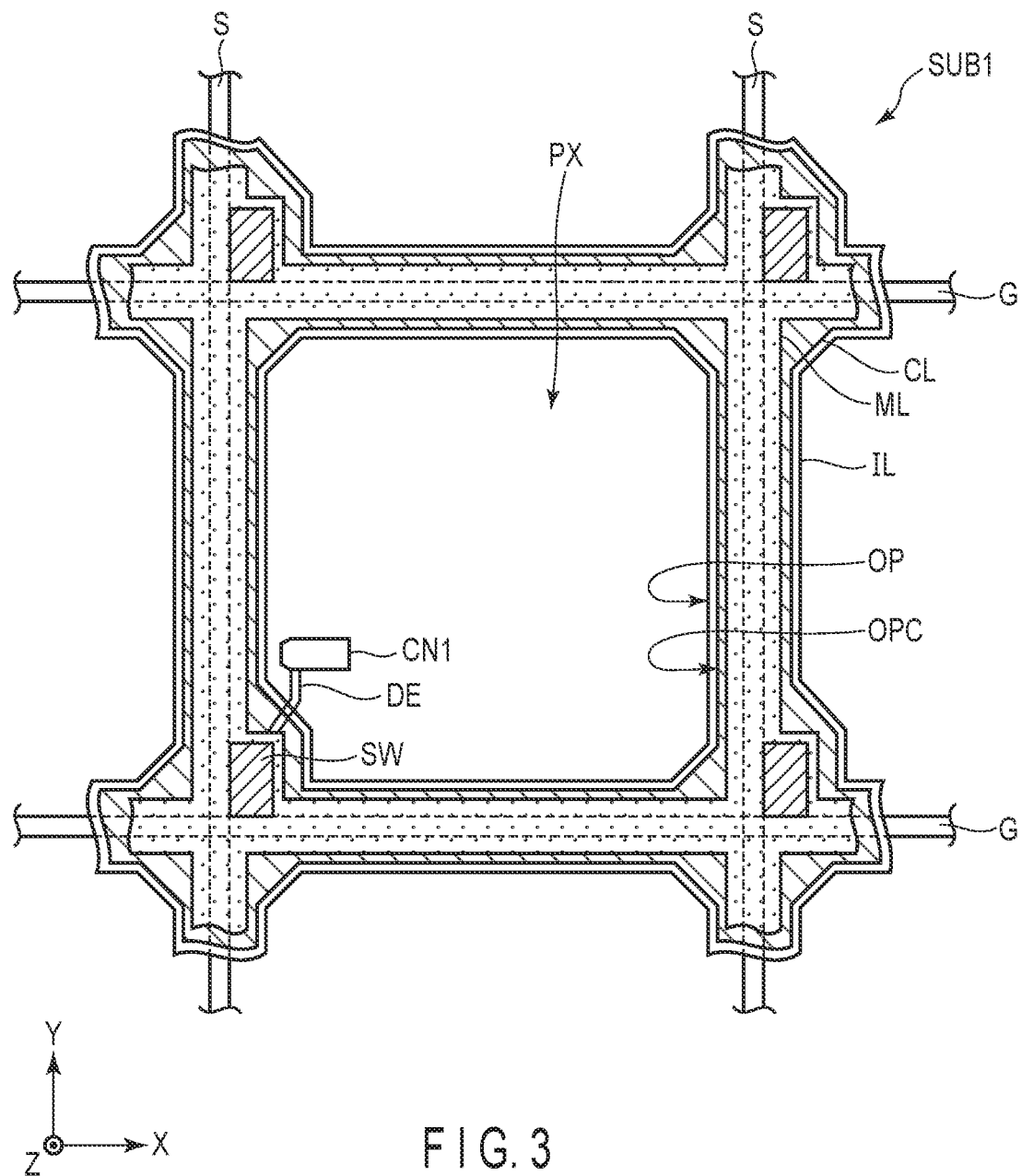
FIG. 3 is a plan view showing an example of the pixel PX.

FIG. 3 is a plan view showing an example of the pixel PX. Only a part of the configurations included in the first substrate SUB1 is shown in the figure.

The first substrate SUB1 comprises a plurality of scanning lines G, a plurality of signal lines S, a switching element SW, a feed line CL, a metal line ML, an insulating film IL, and a connection electrode CN1.

As described above, each of the plurality of scanning lines G extends in the first direction X. Each of the plurality of signal lines S extends in the second direction Y and intersects the plurality of scanning lines G. In the present specification, the pixel PX corresponds to an area defined by two adjacent scanning lines G and two adjacent signal lines S. The switching element SW is arranged at an intersection of the scanning line G and the signal line S.

The insulating film IL is formed in a grating pattern which defines an opening OP in each pixel PX. The insulating film IL is, for example, an organic insulating film. The insulating film IL overlaps with each of the scanning lines G, the signal lines S, and the switching element SW. However, a drain electrode DE of the switching element SW extends to the opening OP. The connection electrode CN1 is formed in an island shape, is located at the opening OP, and is electrically connected to one end portion of the drain electrode DE.

The feed line CL is arranged on the insulating film IL and is formed in a grating pattern surrounding the pixel PX. The planar shape of the feed line CL is substantially the same as the planar shape of the insulating film IL. The feed line CL is separated from the connection electrode CN1. An opening OPC of the feed line CL overlaps with the opening OP of the insulating film IL.

The metal line ML is arranged on the feed line CL and is formed in a grating pattern surrounding the pixel PX. The metal line ML is formed to have a width smaller than that of the feed line CL, and does not protrude from the feed line CL in planar view. These feed line CL and metal line ML overlap with each of the scanning line G, the signal line S, and the switching element SW.

Figure 4:
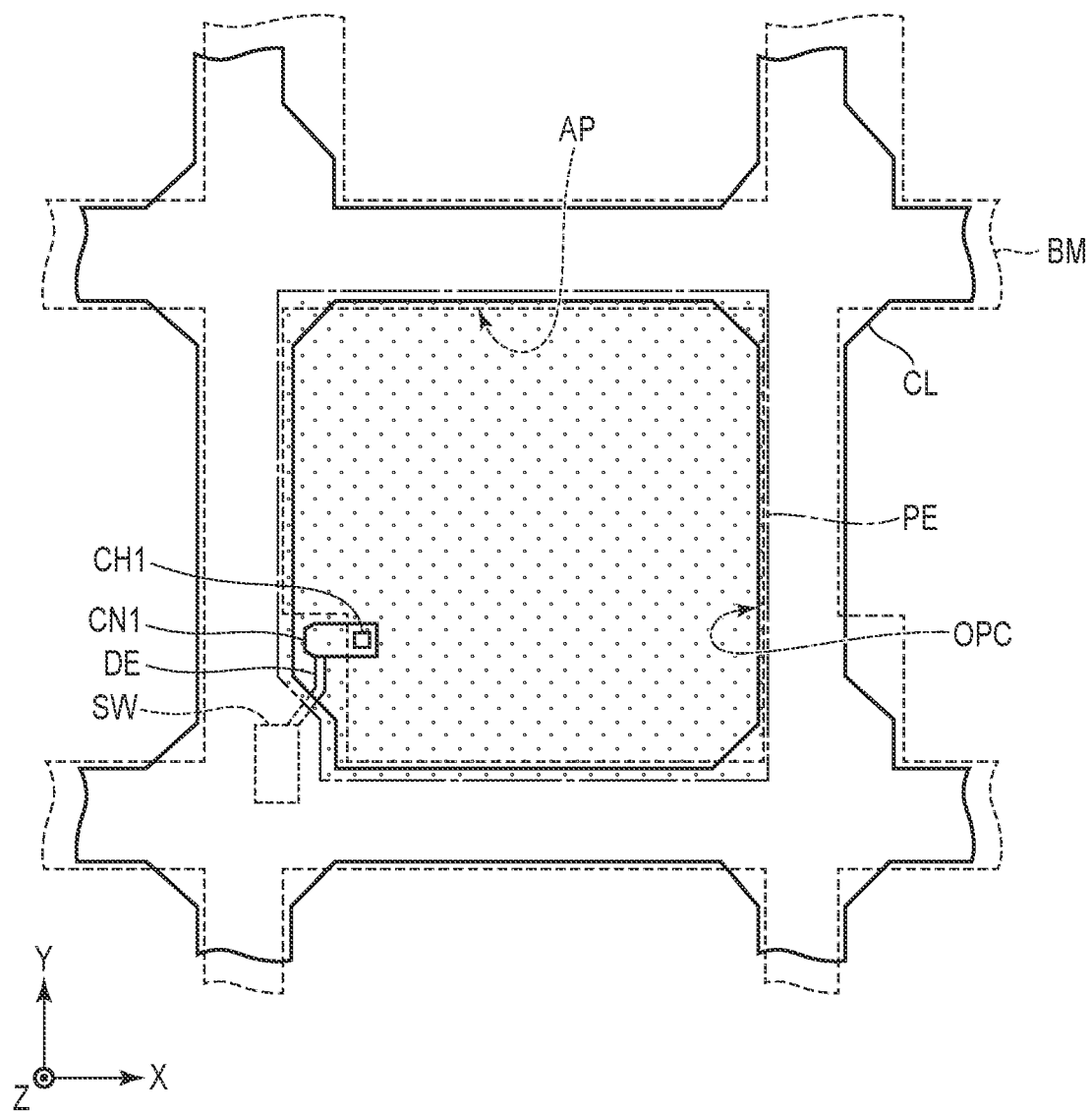
FIG. 4 is a plan view showing an example of the pixel electrode PE arranged in the pixel PX shown in FIG. 3.

FIG. 4 is a plan view showing an example of the pixel electrode PE arranged in the pixel PX shown in FIG. 3. The pixel electrode PE represented by a one-dot chain line overlaps with the opening OPC of the feed line CL. In addition, a peripheral portion of the pixel electrode PE overlaps with the feed line CL. An insulating film is interposed between the pixel electrode PE and the feed line CL, and the capacitance CS shown in FIG. 2 is formed between the peripheral portion of the pixel electrode PE and the feed line CL.

The connection electrode CN1 is located at the opening OPC. The pixel electrode PE overlaps with the connection electrode CN1 at the opening OPC. A contact hole CH1 is formed in the insulating film interposed between the pixel electrode PE and the connection electrode CN1. The pixel electrode PE is in contact with the connection electrode CN1 in the contact hole CH1. The pixel electrode PE is thereby electrically connected to the switching element SW.

In FIG. 4, a light-shielding layer BM provided on the second substrate SUB2 is represented by a dotted line. The light-shielding layer BM is formed in a grating pattern and overlaps with several parts of the feed line CL, the switching element SW, the connection electrode CN1, and the like in planar view. Of course, the light-shielding layer BM also overlaps with the scanning line G, the signal line S, and the metal line ML shown in FIG. 3. In addition, the light-shielding layer BM includes an aperture AP which overlaps with the pixel electrode PE in planar view.

Figure 5:
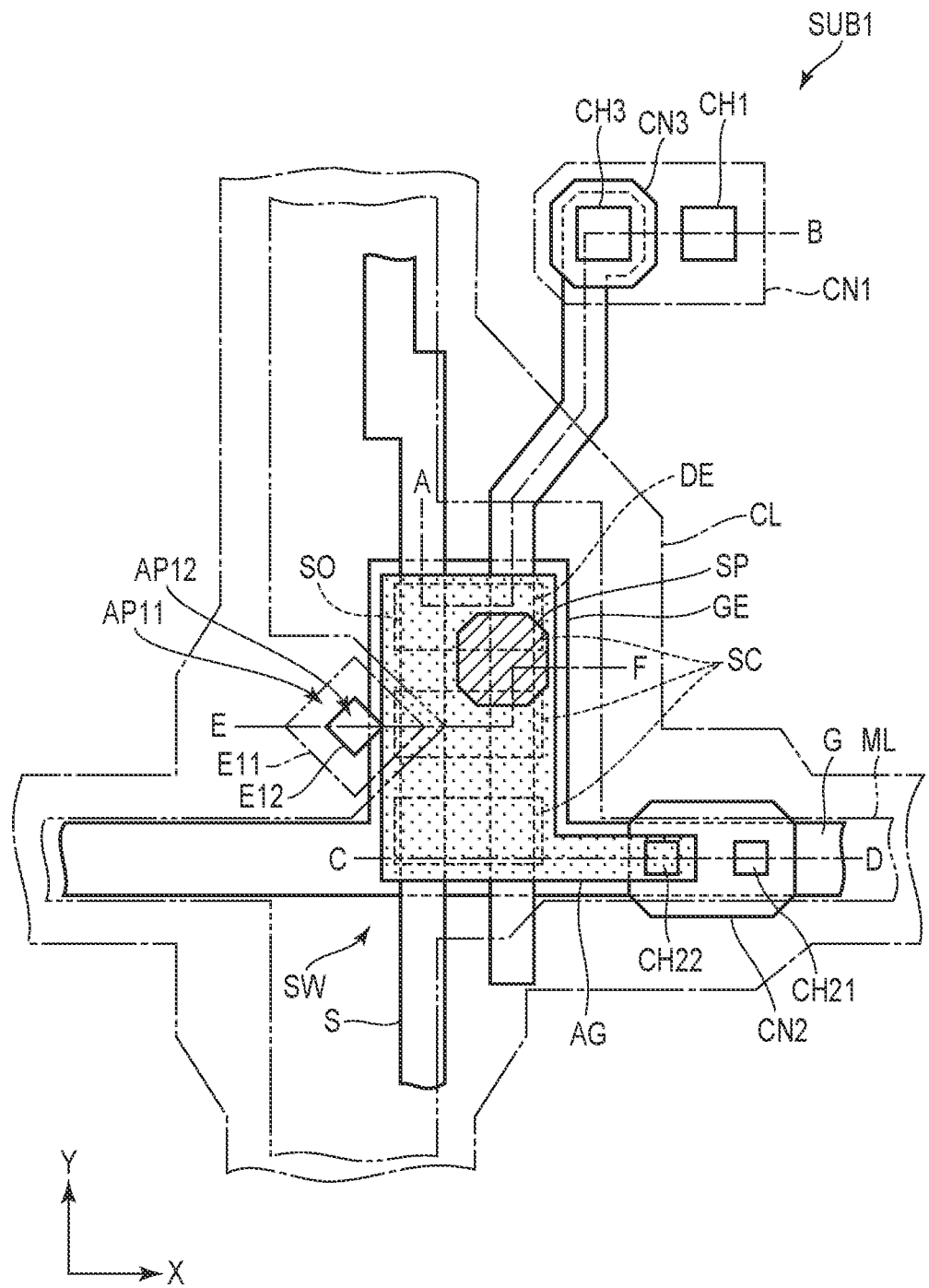
FIG. 5 is a plan view showing an example of the first substrate SUB1 including the switching element SW shown in FIG. 4.

FIG. 5 is a plan view showing an example of the first substrate SUB1 including the switching element SW shown in FIG. 4. The switching element SW comprises a semiconductors SC, a gate electrode (or first gate electrode) GE integrated with the scanning line G, a source electrode SO integrated with the signal line S, the drain electrode DE, and an auxiliary gate electrode (or second gate electrode) AG.

The semiconductor SC is an oxide semiconductor. The semiconductor SC may be a silicon-based semiconductor of polycrystalline silicon, amorphous silicon or the like. In the example shown in FIG. 5, three semiconductors SC overlap with the gate electrode GE and are arranged at intervals along the second direction Y. The auxiliary gate electrode AG overlaps with the gate electrode GE and the semiconductors SC. The semiconductors SC are located between the gate electrode GE and the auxiliary gate electrode AG. The auxiliary gate electrode AG further overlaps with the scanning line G. A connection electrode CN2 is interposed between the scanning line G and the auxiliary gate electrode AG.

A contact hole CH21 is formed in an insulating film interposed between the scanning line G and the connection electrode CN2. The connection electrode CN2 is in contact with the scanning line G in the contact hole CH21. A contact hole CH22 is formed in an insulating film interposed between the connection electrode CN2 and the auxiliary gate electrode AG. The auxiliary gate electrode AG is in contact with the connection electrode CN2 in the contact hole CH22. The auxiliary gate electrode AG is thereby electrically connected to the scanning line G, similarly to the gate electrode GE. In other words, the gate electrode GE and the auxiliary gate electrode AG have the same potential as the scanning line G.

Each of the source electrode SO and the drain electrode DE extends along the second direction Y, and the source electrode SO and the drain electrode DE are arranged at intervals along the first direction X. The source electrode SO is in contact with one end side of each of the semiconductors SC. The drain electrode DE is in contact with the other end side of each of the semiconductors SC.

One end portion of the drain electrode DE overlaps with a connection electrode CN3. A contact hole CH3 is formed in an insulating film interposed between the drain electrode DE and the connection electrode CN3. The drain electrode DE is in contact with the connection electrode CN3 in the contact hole CH3. The connecting electrode CN1 represented by a one-dot chain line is in contact with the connection electrode CN3. The connection electrode CN1 is thereby electrically connected to the switching element SW, and electrically connected to the pixel electrode PE shown in FIG. 4 in the contact hole CH1.

The feed line CL represented by a one-dot chain line overlaps with the gate electrode GE and the auxiliary gate electrode AG of the switching element SW. The feed line CL includes a first aperture (through hole) AP11. In addition, an insulating film arranged on the feed line CL includes a second aperture (through hole) AP12. In the example shown in FIG. 5, each of an edge E11 which defines the first aperture AP11 and an edge E12 which defines the second aperture AP12, is formed in a quadrangular shape. In addition, the edge E12 is located inside the edge E11 without intersecting the edge E11. The edge E11 and the edge E12 are not limited to the examples shown in the figure, but may be formed in a shape such as the other polygonal shape, a circular shape, or an elliptical shape. In addition, the edge E11 and the edge E12 may intersect each other or the edge E11 may be located inside the edge E12.

The metal line ML represented by a two-dot chain line overlaps with the feed line CL and also overlaps with a part of the switching element SW. The spacer SP overlaps with the switching element SW, the feed line CL, and the metal line ML. The metal line ML and the spacer SP do not overlap with the first aperture AP11 or the second aperture AP12.

Figure 6:
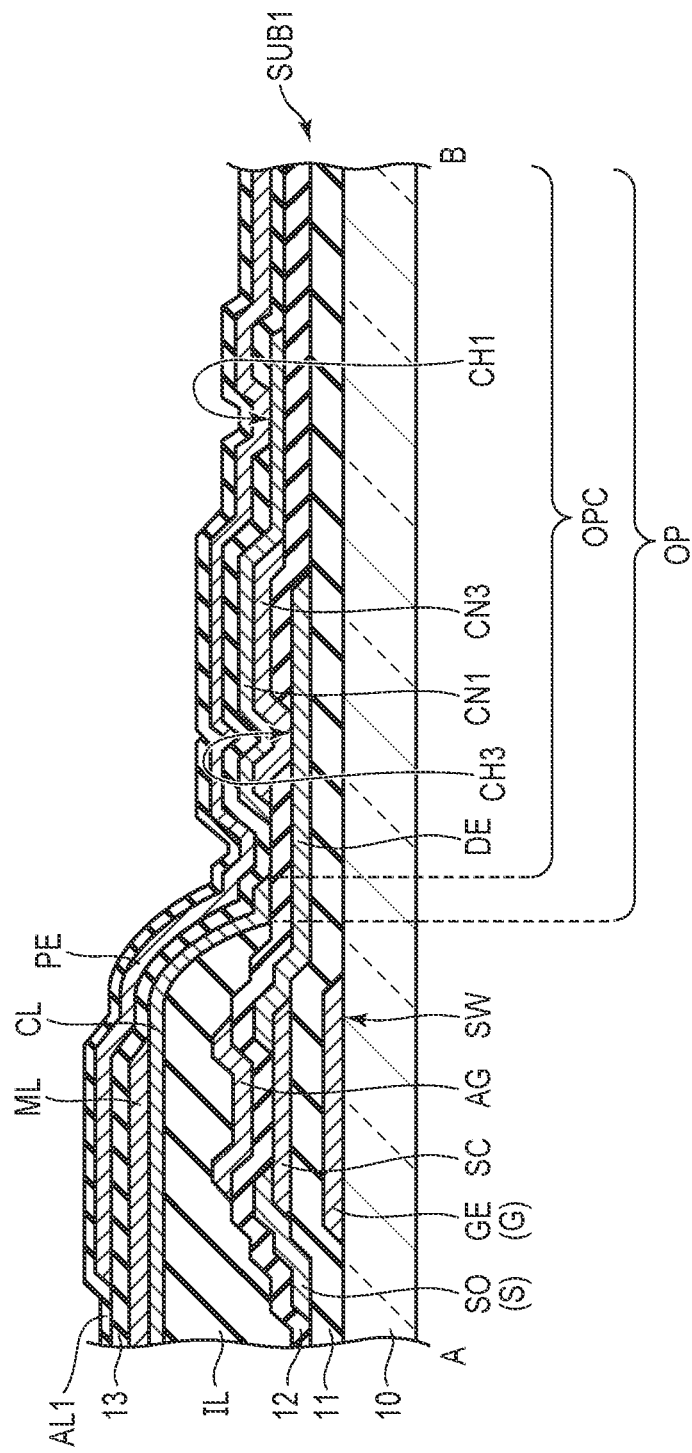
FIG. 6 is a cross-sectional view showing an example of the first substrate SUB1 along line A-B shown in FIG. 5.

FIG. 6 is a cross-sectional view showing an example of the first substrate SUB1 along line A-B shown in FIG. 5. The first substrate SUB1 comprises the first transparent substrate 10, the insulating films 11 to 13, the insulating film IL, the switching element SW, the feed line CL, the metal line ML, the pixel electrode PE, and the alignment film AL1.

The gate electrode GE integrated with the scanning line G is arranged on the first transparent substrate 10. The insulating film 11 covers the first transparent substrate 10 and the gate electrode GE. The semiconductor SC is arranged on the insulating film 11 and is located directly above the gate electrode GE. The source electrode SO integrated with the signal line S, and the drain electrode DE are arranged on the insulating film 11 and each of the electrodes is in contact with the semiconductor SC. These source electrode SO and drain electrode DE are formed of the same metal material. The insulating film 12 covers the insulating film 11, the source electrode SO, and the drain electrode DE. In addition, the insulating film 12 is in contact with the semiconductor SC at a position between the source electrode SO and the drain electrode DE.

The auxiliary gate electrode AG is arranged on the insulating film 12 and is located directly above the gate electrode GE and the semiconductor SC. The connection electrode CN3 is arranged on the insulating film 12 and is in contact with the drain electrode DE in the contact hole CH3 formed in the insulating film 12. The auxiliary gate electrode AG and the connection electrode CN3 are formed of the same metal material. The insulating film IL covers the auxiliary gate electrode AG. In contrast, the connection electrode CN3 is located at the opening OP and is exposed from the insulating film IL.

The feed line CL is arranged on the insulating film IL. The connection electrode CN1 is separated from the feed line CL and is arranged on the insulating film 12 in the opening OP of the insulating film IL or the opening OPC of the feed line CL. In other words, these feed line CL and connection electrode CN1 are substantially located in the same layer, and are collectively formed by using the same material. The connection electrode CN1 is arranged on the connection electrode CN3 and is in contact with the connection electrode CN3.

The metal line ML is arranged on the feed line CL and is in contact with the feed line CL. The insulating film 13 covers the feed line CL, the metal line ML, and the connection electrode CN1. In addition, the insulating film 13 is in contact with the insulating film 12 between the feed line CL and the connection electrode CN1.

The pixel electrode PE is arranged on the insulating film 13 and is in contact with the connection electrode CN1 in the contact hole CH1 formed in the insulating film 13. A peripheral portion of the pixel electrode PE is opposed to the feed line CL and the metal line ML via the insulating film 13. The alignment film AL1 covers the pixel electrode PE and the insulating film 13.

The insulating films 11 to 13 are, for example, transparent inorganic insulating films of silicon oxide, silicon nitride, silicon oxynitride or the like. The insulating film IL is, for example, a transparent organic insulating film of an acrylic resin or the like. The feed line CL, the connection electrode CN1, and the pixel electrode PE are transparent electrodes formed of a transparent conductive material such as indium tin oxide (ITO) or indium zinc oxide (IZO).

Figure 7:
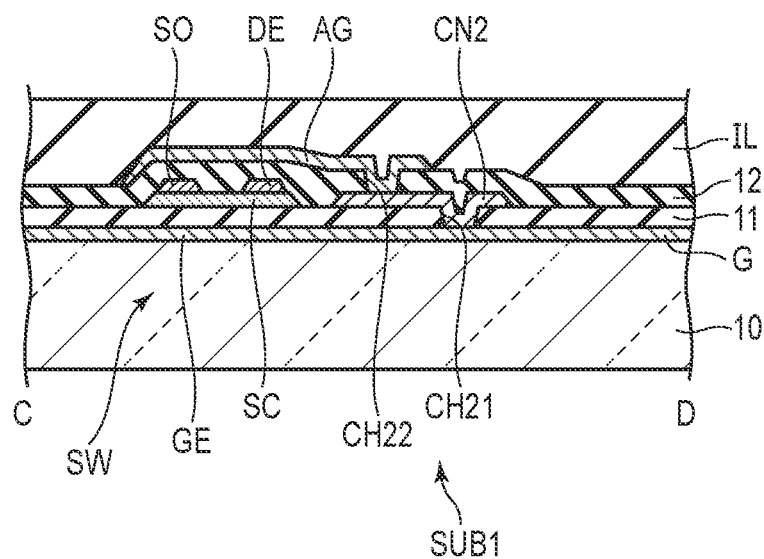
FIG. 7 is a cross-sectional view showing an example of the first substrate SUB1 along line C-D shown in FIG. 5.

FIG. 7 is a cross-sectional view showing an example of the first substrate SUB1 along line C-D shown in FIG. 5. The connection electrode CN2 is arranged on the insulating film 11 and is in contact with the scanning line G in the contact hole CH21 formed in the insulating film 11. The connection electrode CN2 is formed of the same metal material as the source electrode SO and the drain electrode DE. The insulating film 12 covers the insulating film 11, the connection electrode CN2, the source electrode SO, and the drain electrode DE. The auxiliary gate electrode AG is arranged on the insulating film 12 and is in contact with the connection electrode CN2 in the contact hole CH 22 formed in the insulating film 12.

FIG. 8 is a cross-sectional view showing an example of the display panel PNL including the first substrate SUB1 along line E-F shown in FIG. 5. As described above, the switching element SW is covered with the insulating film IL which is an organic insulating film. The feed line CL which is a transparent electrode is in contact with an upper surface ILT of the insulating film IL. The first aperture AP11 of the feed line CL penetrates to the upper surface ILT. The insulating film 13 which is an inorganic insulating film is in contact with the feed line CL and is also in contact with the upper surface ILT in the first aperture AP11. The second aperture AP12 of the insulating film 13 penetrates to the upper surface ILT, in the first aperture AP11. In other words, the upper surface ILT is exposed from the feed line CL (transparent electrode) and the insulating film 13 (inorganic insulating film), in the second aperture AP12. In the example shown in FIG. 8, the alignment film AL1 is in contact with the upper surface ILT in the second aperture AP12.

The second substrate SUB2 comprises the second transparent substrate 20, the light-shielding layer BM, the common electrode CE, and an alignment film AL2. The spacer SP is arranged between the first transparent substrate 10 and the second transparent substrate 20. In the example shown in FIG. 8, the spacer SP is provided in the second substrate SUB2.

The light-shielding layer BM is opposed to the first aperture AP11, the second aperture AP12, the switching element SW, and the like via the liquid crystal layer LC. In addition, the light-shielding layer BM is also opposed to the spacer SP. The common electrode CE is opposed to the pixel electrode PE via the liquid crystal layer LC. The alignment film AL2 covers the common electrode CE and the spacer SP. In the example shown in FIG. 8, the spacer SP corresponds to a main spacer which is in contact with the first substrate SUB1 (or alignment film AL1) to form a cell gap.

The spacer SP may be a sub-spacer separated from the first substrate SUB1 (or alignment film AL1). In addition, the alignment film AL2 may be interposed between the spacer SP and the alignment film AL1. Alternatively, a transparent organic insulating film may be interposed between the light-shielding layer BM and the common electrode CE or between the common electrode CE and the alignment film AL2.

As described above, according to the present embodiment, a part of the upper surface ILT of the insulating film IL which is the organic insulating film is exposed in the area where the first aperture AP11 of the feed line CL and the second aperture AP12 of the insulating film 13 overlap. Such an area can serve as a discharge port for moisture contained in the insulating film IL. In other words, the moisture contained in the insulating film IL is discharged to the outside from the discharge port at a stage before the alignment film AL1 is formed, in the process of manufacturing the first substrate SUB1. As a result, the content of moisture in the insulating film IL is reduced, and the deterioration in performance caused by the moisture of the switching element SW covered with the insulating film IL is suppressed. Therefore, the reduction in reliability which results from the deterioration in performance of the switching element can be suppressed.

In addition, as shown in FIG. 5, most parts of the gate electrode GE and the auxiliary gate electrode AG to which a relatively high voltage is applied, of the switching element SW, are covered with the feed line CL having the same potential as the common electrode CE. An undesired leakage field from the gate electrode GE is thereby blocked. Therefore, the alignment failure of the liquid crystal molecules 32 caused by the leakage field from the gate electrode GE can be suppressed.

Figure 9:
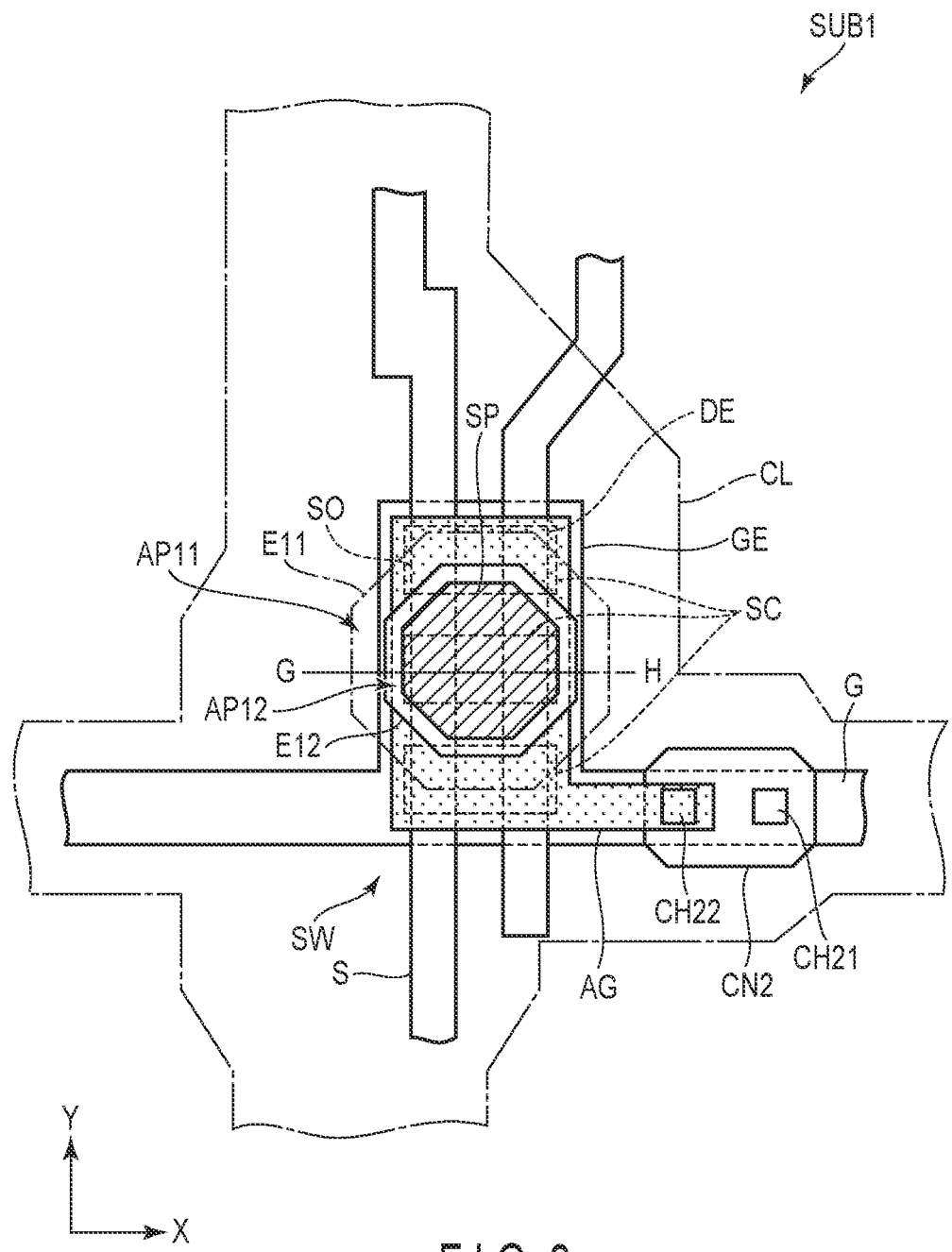
FIG. 9 is a plan view showing another example of the first substrate SUB1 including the switching element SW shown in FIG. 4.

FIG. 9 is a plan view showing another example of the first substrate SUB1 including the switching element SW shown in FIG. 4. The example shown in FIG. 9 is different from the example shown in FIG. 5 in that the first aperture AP11 and the second aperture AP12 overlap with the switching element SW and that the spacer SP overlaps with the first aperture AP11 and the second aperture AP12.

In the example shown in FIG. 9, the edge E12 which defines the second aperture AP12 is located inside the edge E11 without intersecting the edge E11 which defines the first aperture AP11. The spacer SP is located inside the edge E12 and overlaps with the switching element SW, or the gate electrode GE and the auxiliary gate electrode AG.

Figure 10:
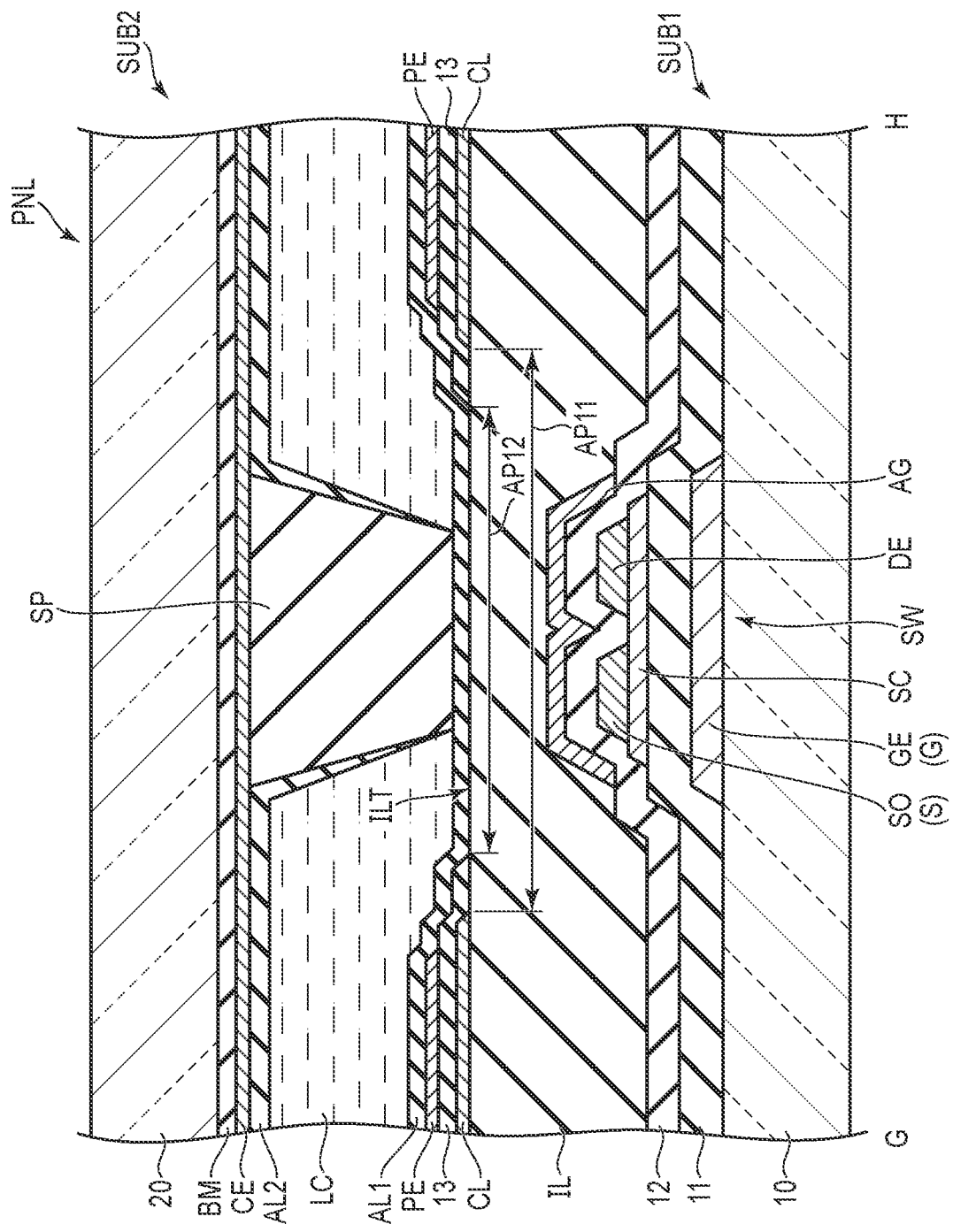
FIG. 10 is a cross-sectional view showing an example of the display panel PNL including the first substrate SUB1 along line G-H shown in FIG. 9.

FIG. 10 is a cross-sectional view showing an example of the display panel PNL including the first substrate SUB1 along line G-H shown in FIG. 9. The first aperture AP11 of the feed line CL, and the second aperture AP12 of the insulating film 13 are formed directly above the switching element SW or directly above the gate electrode GE and the auxiliary gate electrode AG. The first aperture AP11 penetrates to the upper surface ILT. The second aperture AP12 penetrates to the upper surface ILT, in the first aperture AP11. In other words, the upper surface ILT is exposed from the feed line CL (transparent electrode) and the insulating film 13 (inorganic insulating film), in the second aperture AP12. The alignment film AL1 is in contact with the upper surface ILT in the second aperture AP12.

The spacer SP is located directly above the switching element SW or directly above the gate electrode GE and the auxiliary gate electrode AG. In the example shown in FIG. 10, the spacer SP is a main spacer which is in contact with the first substrate SUB1 (or alignment film AL1), but may be a sub-spacer separated from the first substrate SUB1 (or alignment film AL1). The light-shielding layer BM is opposed to the first aperture AP11, the second aperture AP12, and the spacer SP.

In the examples described with reference to FIG. 9 and FIG. 10, the same advantages as those described above can also be obtained.

In addition, the spacer SP is arranged so as to overlap with most parts of the gate electrode GE and the auxiliary gate electrode AG to which a relatively high voltage is applied. For this reason, an undesired leakage field from the gate electrode GE is less likely to be applied to the liquid crystal layer LC. Therefore, the alignment failure of the liquid crystal molecules 32 caused by the leakage field from the gate electrode GE can be suppressed.

Furthermore, when ionic impurities are generated in the liquid crystal layer LC, impurities can be collected around the spacer SP which does not contribute to the display by utilizing the leakage field from the gate electrode GE.

Figure 11:
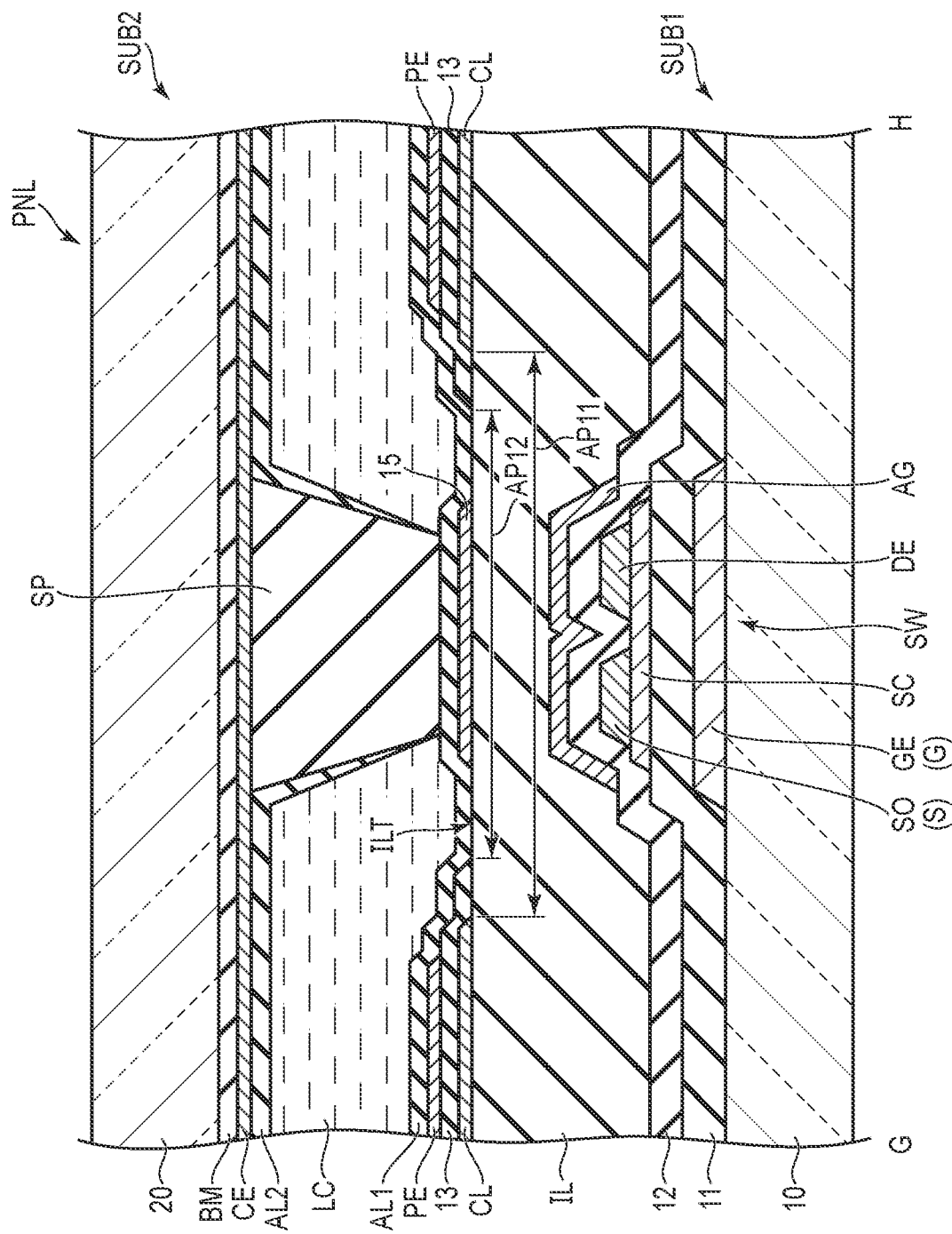
FIG. 11 is a cross-sectional view showing another example of the display panel PNL including the first substrate SUB1 along line G-H shown in FIG. 9.

FIG. 11 is a cross-sectional view showing another example of the display panel PNL including the first substrate SUB1 along line G-H shown in FIG. 9. The example shown in FIG. 11 is different from the example shown in FIG. 10 in that an island-shaped base 15 overlapping with the spacer SP is arranged in the second aperture AP12. The base 15 is in contact with the upper surface ILT and is separated from the feed line CL and the insulating film 13. The alignment film AL1 is in contact with the upper surface ILT between the base 15 and the insulating film 13.

Such a base 15 includes at least one of a thin film formed of a transparent conductive material which is the same as the material of the feed line CL, a thin film formed of a transparent insulating material which is the same as the material of the insulating film 13, and a thin film formed of a transparent conductive material which is the same as the material of the pixel electrode PE. In other words, the base 15 may be a single-layered body of the thin film or a stacked layer body of a plurality of thin films.

In the example described with reference to FIG. 11, too, the upper surface ILT is exposed between the base 15 and the insulating film 13 before the alignment film AL1 is formed, and can serve as a moisture discharge port. For this reason, the same advantages as those described above can be obtained.

In addition, even if the spacer SP rubs the surface of the alignment film AL1 when an external force is applied, the area of the alignment film AL1 that may be damaged is limited to the area directly above the base 15, and this area is shielded against light by the light-shielding layer BM. For this reason, degradation in display quality can be suppressed.

Figure 12:
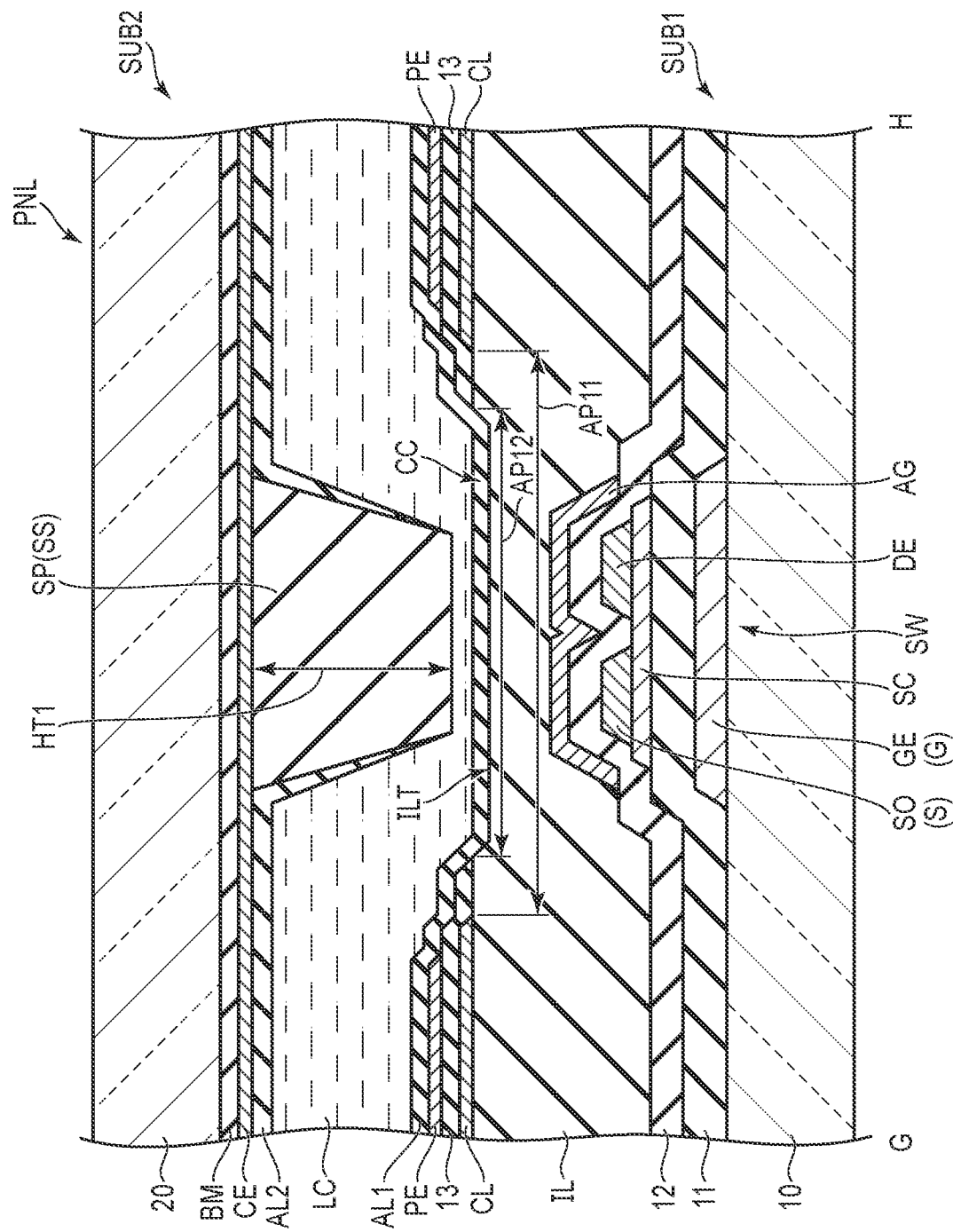
FIG. 12 is a cross-sectional view showing another example of the display panel PNL including the first substrate SUB1 along line G-H shown in FIG. 9.

FIG. 12 is a cross-sectional view showing another example of the display panel PNL including the first substrate SUB1 along line G-H shown in FIG. 9. The example shown in FIG. 12 is different from the above-described examples in that the insulating film IL includes a recess CC in the second aperture AP12. Such a recess CC is formed by etching under conditions that not only the insulating film 13 is removed but also the surface of the insulating film IL is removed when, for example, the second aperture AP12 is formed in the insulating film 13. The alignment film AL1 is in contact with the upper surface ILT of the recess CC in the second aperture AP12.

The spacer SP is a sub-spacer SS separated from the first substrate SUB1 (or alignment film AL1), but may be a main spacer which is in contact with the first substrate SUB1 (or alignment film AL1).

In the example described with reference to FIG. 12, too, the upper surface ILT is exposed in the recess CC before the alignment film AL1 is formed, and can serve as a moisture discharge port. In particular, similarly to the example shown in FIG. 10, the surface area of the upper surface ILT which can serve as a discharge port is increased and the moisture release is promoted as compared with the case where the insulating film IL does not include the recess CC.

FIG. 13 is a cross-sectional view showing yet another example of the display panel PNL including the first substrate SUB1 along line G-H shown in FIG. 9. The example shown in FIG. 13 is different from the example shown in FIG. 12 in that an island-shaped base 15 overlapping with the spacer SP is arranged in the second aperture AP12. The base 15 is in contact with the upper surface ILT in the recess CC and is separated from the feeder line CL and the insulating film 13. The alignment film AL1 is in contact with the upper surface ILT between the base 15 and the insulating film 13. As described with reference to FIG. 11, the base 15 includes at least one of a thin film formed of a transparent conductive material and a thin film formed of a transparent insulating material.

The spacer SP is a main spacer MS which is in contact with the first substrate SUB1 (or alignment film AL1), but may be a sub-spacer separated from the first substrate SUB1 (or alignment film AL1). For example, when a height HT1 of the spacer SP in the example shown in FIG. 12 and a height HT2 of the spacer SP in the example shown in FIG. 13 are the same as each other, the spacer SP can also be the main spacer MS or the sub-spacer SS depending on the presence or absence of the base 15.

Next, a configuration example of the display device DSP according to the embodiment will be described.

Figure 14:
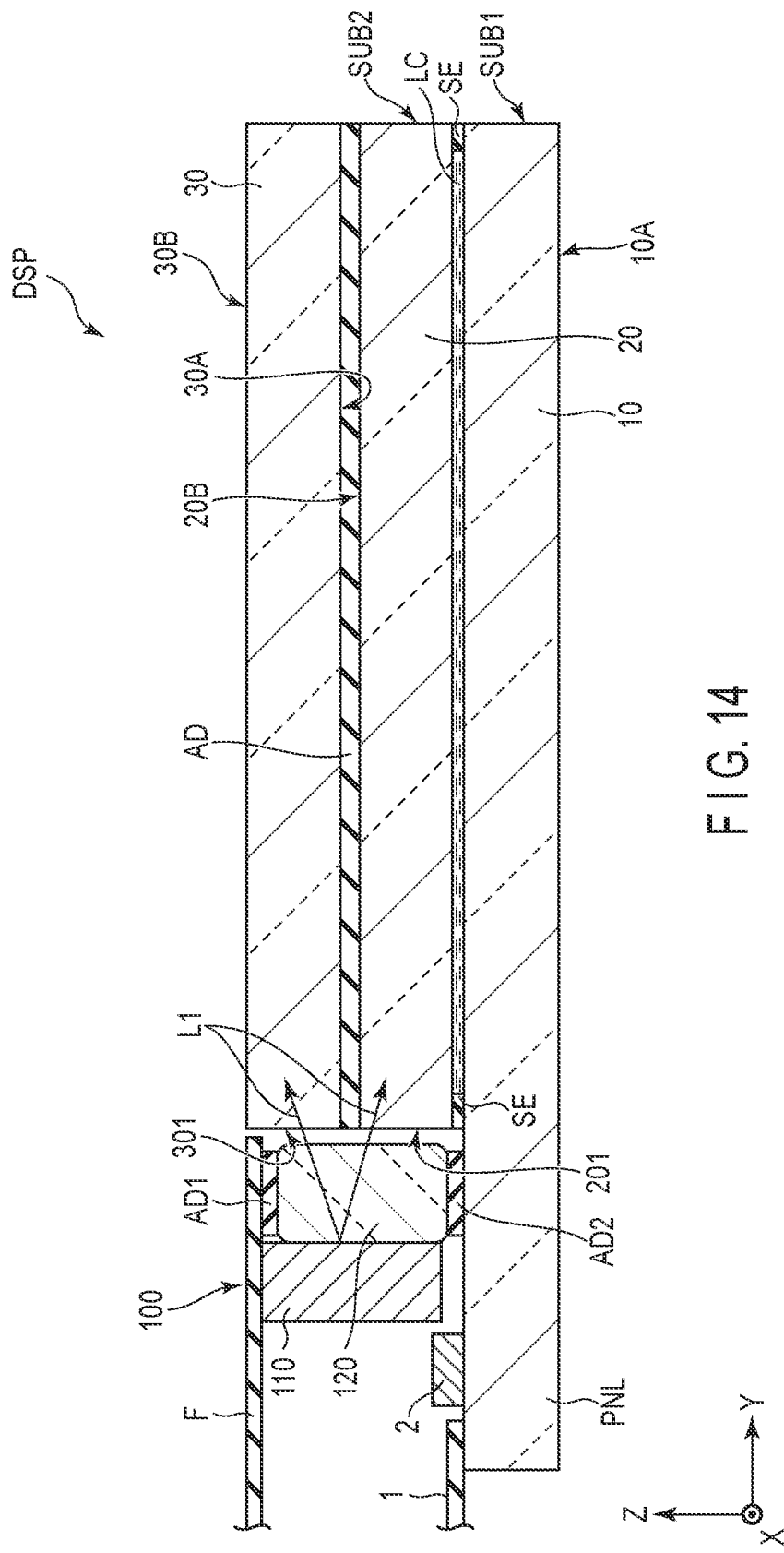
FIG. 14 is a cross-sectional view of the display device DSP.

FIG. 14 is a cross-sectional view of the display device DSP. The only main parts of the display panel PNL are simplified and illustrated.

The display panel PNL further comprises a third transparent substrate 30 in addition to the first substrate SUB1 and the second substrate SUB2. An inner surface 30A of the third transparent substrate 30 is opposed to an outer surface 20B of the second transparent substrate 20 in the third direction Z. An adhesive layer AD bonds the second transparent substrate 20 and the third transparent substrate 30. The third transparent substrate 30 is, for example, a glass substrate, but may be an insulating substrate such as a plastic substrate. The third transparent substrate 30 has a refractive index equivalent to the refractive indexes of the first transparent substrate 10 and the second transparent substrate 20. The adhesive layer AD has a refractive index equivalent to the refractive index of each of the second transparent substrate 20 and the third transparent substrate 30.

A side surface 301 of the third transparent substrate 30 is located directly above the side surface 201 of the second transparent substrate 20. The light emitting element 110 of the light emitting module 100 is electrically connected to the wiring board F, and is provided between the first substrate SUB1 and the wiring board F in the third direction Z. The light guide 120 is provided between the light emitting element 110 and the side surface 201 and between the light emitting element 110 and the side surface 301, in the second direction Y. The light guide 120 is bonded to the wiring board F by the adhesive layer AD1 and is bonded to the first substrate SUB1 by the adhesive layer AD2.

Next, the light L1 emitted from the light emitting element 110 will be described with reference to FIG. 14.

The light emitting element 110 emits the light L1 toward the light guide 120. The light L1 emitted from the light emitting element 110 propagates along a direction of an arrow indicating the second direction Y, passes through the light guide 120, is made incident on the second transparent substrate 20 from the side surface 201, and is made incident on the third transparent substrate 30 from the side surface 301. The light L1 made incident on the second transparent substrate 20 and the third transparent substrate 30 propagates through the inside of the display panel PNL while repeatedly reflected. The light L1 made incident on the liquid crystal layer LC to which no voltage is applied, almost is not scattered, but is transmitted through the liquid crystal layer LC. In addition, the light L1 made incident on the liquid crystal layer LC to which a voltage is applied is scattered by the liquid crystal layer LC.

This display device DSP can be observed not only from the outer surface 10A side of the first transparent substrate 10, but also from the outer surface 30B side of the third transparent substrate 30. In addition, even when the display device DSP is observed from the outer surface 10A side or observed from the outer surface 30B side, a background of the display device DSP can be observed via the display device DSP.

Next, the first substrate SUB1 applicable to other display devices or electronic devices that do not require the alignment film AL1 will be described.

Figure 15:
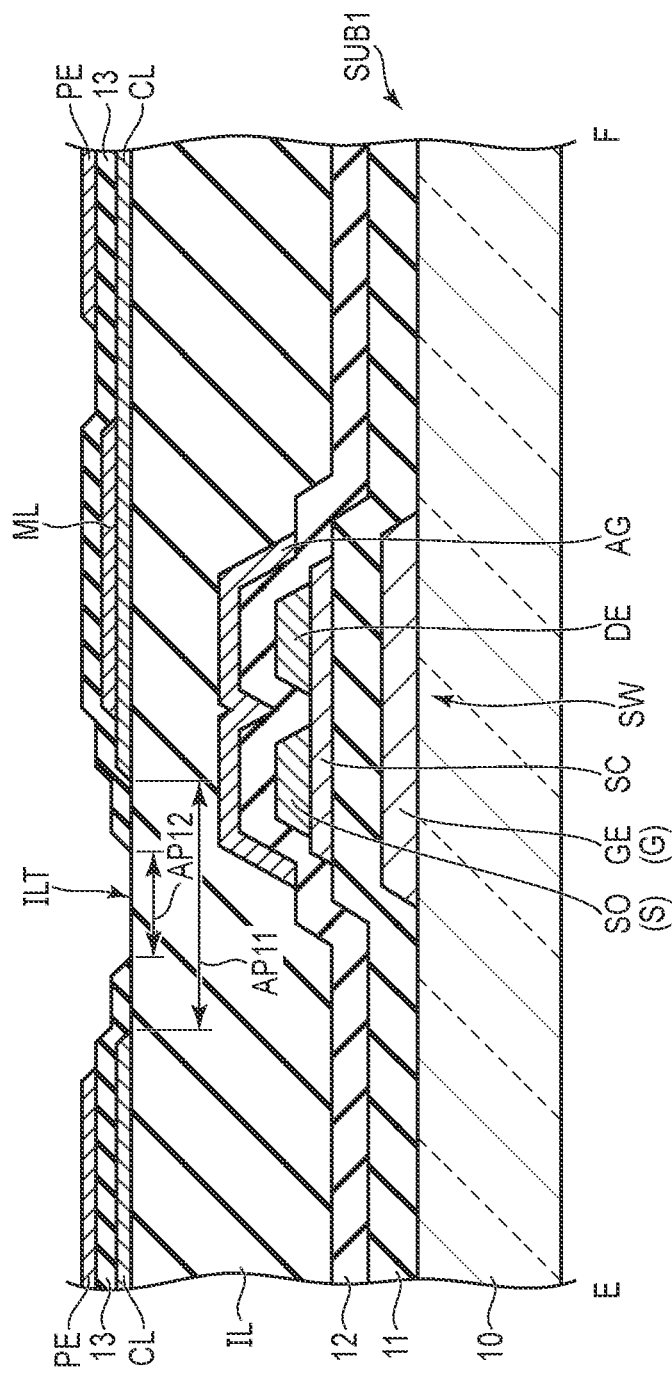
FIG. 15 is a cross-sectional view showing another example of the display panel PNL including the first substrate SUB1 along line E-F shown in FIG. 5.

FIG. 15 is a cross-sectional view showing another example of the display panel PNL including the first substrate SUB1 along line E-F shown in FIG. 5. The example shown in FIG. 15 is different from the example shown in FIG. 8 in that the alignment film AL1 is omitted. Even in such an example, the area where the first aperture AP11 and the second aperture AP12 overlap can serve as a discharge port of moisture contained in the insulating film IL. Therefore, the amount of moisture in the insulating film IL covering the switching element SW is reduced, and the degradation in performance of the switching element SW and the reduction in reliability can be suppressed.

In each of the examples shown in FIG. 10 to FIG. 13, too, the same advantages as those described above can be obtained by omitting the alignment film AL1, similarly to the example shown in FIG. 15.

As described above, according to the present embodiment, the display device capable of suppressing the reduction in reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate comprising a first transparent substrate, a switching element comprising an oxide semiconductor, an organic insulating film covering the switching element, a transparent electrode including a first aperture penetrating to an upper surface of the organic insulating film, an inorganic insulating film including a second aperture penetrating to the upper surface in the first aperture, and a pixel electrode electrically connected to the switching element;
    a second substrate comprising a second transparent substrate and opposed to the first substrate;
    a spacer arranged between the first transparent substrate and the second transparent substrate and overlapping the switching element in the second aperture; and
    an island-shaped base overlapping the spacer in the second aperture,
    wherein the base is in contact with the upper surface and is separated from the inorganic insulating film.

2. The display device of claim 1, wherein
    the switching element comprises a gate electrode, and
    the transparent electrode overlaps the gate electrode.

3. The display device of claim 1, wherein
    the switching element comprises a gate electrode, and
    the spacer overlaps the gate electrode.

4. The display device of claim 1, wherein
the base includes at least one of a thin film formed of a transparent conductive material and a thin film formed of a transparent insulating material.

5. The display device of claim 1, wherein
the organic insulating film includes a recess in the second aperture.

6. The display device of claim 1, wherein
the first substrate further comprises an alignment film covering the pixel electrode, and
the alignment film is in contact with the upper surface in the second aperture.

7. The display device of claim 1, further comprising:
a liquid crystal layer arranged between the first substrate and the second substrate and containing polymer dispersed liquid crystal; and
a light emitting module arranged along a side surface of the second transparent substrate.

8. The display device of claim 7, wherein
the first substrate further comprises a scanning line and a signal line which are electrically connected to the switching element, and
the organic insulating film overlaps the scanning line, the signal line, and the switching element, and is formed in a grating pattern.

9. A display device comprising:
a first substrate comprising a first transparent substrate, a switching element comprising an oxide semiconductor, an organic insulating film covering the switching element, a transparent electrode including a first aperture penetrating to an upper surface of the organic insulating film, an inorganic insulating film including a second aperture penetrating to the upper surface in the first aperture, and a pixel electrode electrically connected to the switching element;
a second substrate comprising a second transparent substrate and opposed to the first substrate; and
an island-shaped base overlapping a spacer in the second aperture, wherein
the switching element comprises a gate electrode,
the transparent electrode overlaps the gate electrode, and
the base is in contact with the upper surface and is separated from the inorganic insulating film.

10. A display device comprising:
a first substrate comprising a first transparent substrate, a switching element comprising an oxide semiconductor, an organic insulating film covering the switching element, a transparent electrode including a first aperture penetrating to an upper surface of the organic insulating film, an inorganic insulating film including a second aperture penetrating to the upper surface in the first aperture, and a pixel electrode electrically connected to the switching element;
a second substrate comprising a second transparent substrate and opposed to the first substrate; and
an island-shaped base arranged in the second aperture, wherein
the base is in contact with the upper surface and is separated from the inorganic insulating film.

* * * * *